US010629321B2

(12) United States Patent
Aksit et al.

(10) Patent No.: US 10,629,321 B2
(45) Date of Patent: Apr. 21, 2020

(54) MISFIT P-TYPE TRANSPARENT CONDUCTIVE OXIDE (TCO) FILMS, METHODS AND APPLICATIONS

(71) Applicant: CORNELL UNIVERSITY, Ithaca, NY (US)

(72) Inventors: Mahmut Aksit, Woodbury, MN (US); Richard D. Robinson, Ithaca, NY (US)

(73) Assignee: CORNELL UNIVERSITY, Ithaca, NY (US)

( * ) Notice: Subject to any disclaimer, the term of this patent is extended or adjusted under 35 U.S.C. 154(b) by 407 days.

(21) Appl. No.: 15/302,319

(22) PCT Filed: Apr. 9, 2015

(86) PCT No.: PCT/US2015/025100
§ 371 (c)(1),
(2) Date: Oct. 6, 2016

(87) PCT Pub. No.: WO2015/157513
PCT Pub. Date: Oct. 15, 2015

(65) Prior Publication Data
US 2017/0025196 A1 Jan. 26, 2017

Related U.S. Application Data

(60) Provisional application No. 61/977,419, filed on Apr. 9, 2014.

(51) Int. Cl.
*B32B 15/04* (2006.01)
*B32B 17/06* (2006.01)
(Continued)

(52) U.S. Cl.
CPC .............. *H01B 1/08* (2013.01); *B05D 1/005* (2013.01); *B05D 3/0254* (2013.01);
(Continued)

(58) Field of Classification Search
USPC ........................................................ 428/688
See application file for complete search history.

(56) References Cited

U.S. PATENT DOCUMENTS 3,457,106 A 7/1969 Gillery
3,505,108 A 4/1970 Mochel
(Continued)

FOREIGN PATENT DOCUMENTS

EP 2527300 11/2012
JP 11302017 A 11/1999
(Continued)

OTHER PUBLICATIONS

International Search Report and Written Opinion Form PCT/ISA/220, International Application No. PCT/US2015/025100, International Filing Date Apr. 9, 2015, dated Jul. 27, 2015, pp. 1-15.
(Continued)

*Primary Examiner* — Lauren R Colgan
(74) *Attorney, Agent, or Firm* — Bond, Schoeneck & King, PLLC; Blaine Bettinger; William Greener

(57) ABSTRACT

A p-type transparent conductive oxide (TCO) mixed metal oxide material layer formed upon a substrate has a formula $M1_xM2_yO_z$ generally, $Ca_xCo_yO_z$ more specifically, and $Ca_3Co_4O_9$ most specifically. Embodiments provide that the p-type TCO mixed metal oxide material may be formed absent an epitaxial crystalline relationship with respect to the substrate while using a sol-gel synthesis method that uses a chelating polymer material and not a block copolymer material.

6 Claims, 7 Drawing Sheets

(51) Int. Cl.

| | |
|---|---|
| *H01B 1/08* | (2006.01) |
| *H01L 31/0224* | (2006.01) |
| *H01L 31/18* | (2006.01) |
| *B05D 1/00* | (2006.01) |
| *B05D 3/02* | (2006.01) |

(52) U.S. Cl.
CPC .. *H01L 31/022466* (2013.01); *H01L 31/1884* (2013.01); *B05D 2203/30* (2013.01); *Y02E 10/50* (2013.01)

(56) References Cited

U.S. PATENT DOCUMENTS

| | | | | |
|---|---|---|---|---|
| 5,707,556 | A | 1/1998 | Babinec et al. | |
| 5,707,756 | A | 1/1998 | Inoue et al. | |
| 2004/0177800 | A1* | 9/2004 | Funahashi | C30B 1/02 117/2 |
| 2004/0248394 | A1 | 12/2004 | Kobayashi et al. | |
| 2006/0012306 | A1 | 1/2006 | Bewlay et al. | |
| 2006/0021646 | A1* | 2/2006 | Yotsuhashi | H01L 35/22 136/236.1 |
| 2006/0118160 | A1* | 6/2006 | Funahashi | H01L 35/08 136/236.1 |
| 2006/0202174 | A1 | 9/2006 | Barker et al. | |
| 2007/0144573 | A1* | 6/2007 | Mihara | C03C 17/23 136/205 |
| 2007/0187653 | A1 | 8/2007 | Takeda et al. | |
| 2007/0200123 | A1 | 8/2007 | Yamamichi et al. | |
| 2010/0102450 | A1 | 4/2010 | Narayan | |
| 2010/0102700 | A1 | 4/2010 | Jaiswal et al. | |
| 2010/0247923 | A1 | 9/2010 | Hsu | |
| 2010/0289026 | A1 | 11/2010 | Yamazaki et al. | |
| 2011/0073814 | A1 | 3/2011 | Nordmann et al. | |
| 2012/0163090 | A1* | 6/2012 | Kubo | B82Y 10/00 365/185.18 |
| 2014/0060887 | A1 | 3/2014 | Singh et al. | |
| 2014/0093778 | A1* | 4/2014 | Askit | C30B 29/22 429/231.3 |
| 2014/0318588 | A1* | 10/2014 | Kouma | H01L 35/32 136/200 |
| 2015/0214459 | A1* | 7/2015 | Kouma | H01L 35/32 320/101 |

FOREIGN PATENT DOCUMENTS

| | | |
|---|---|---|
| JP | 2000281346 A | 10/2000 |
| KR | 20110133814 A | 12/2011 |

OTHER PUBLICATIONS

Song, Ying, et al., Preparation of Ca3Co4O9 by polyacrylamide gel processing and its thermoelectric properties, Journal of Sol-Gel Science and Technology, Kluwer Academic Publishers, BO, vol. 44, No. 2, Aug. 22, 2007, pp. 139-144.

Nishio, Keishi et al., Preparation and Thermoelectric Properties of Highly Oriented Na1.5Co2O4 and Ca3Co4O9 Ceramics by the Spark Plasma Sintering Method, Electroceramic Materials and Applications: Ceramic Transactions Series, vol. 196, 2006, pp. 333-341.

Moubah, S., et al., Synthesis and characterization of Ca3Co4O9 thin films prepared by sol-gel spin-coating technique on Al2O3(001), Thin Solid Films, Elsevier-Sequoia S.A. Lausanne, CH, vol. 518, No. 16, Dec. 11, 2009, pp. 4546-4548.

Wang, Shufang et al., Epitaxial Bi2Sr2Co2Oy thin films as a promising p-type transparent conducting oxides, Optical Materials Express, Oct. 1, 2014, vol. 4, No. 10, pp. 2209-2214.

Ohta, Hiromichi et al., Recent Progress in Oxide Thermoelectric Materials: p-Type Ca3Co4O9 and n-Type SrTiO3-, Inorg. Chem., 2008, 47 (19), pp. 8429-8436.

Prasoetsopha, Natkrita et al., Synthesis and Thermoelectric Properties of Ca3Co4O9 Prepared by a Simple Thermal Hydro-Decomposition Method, Materials Science and Nanotechnology Program, Faculty of Science, Khon Kaen University, Khon Daen 40002, Thailand, Dec. 31, 2013, pp. 1-10.

Weidenkaff, A., et al., Devleopment of Perovskite-type Cobaltates and Manganates for Thermoelectric Oxide Modules, Journal of the Korean Ceramic Society, vol. 47, No. 1, pp. 47-53, 2010.

Banerjee, A.N., et al., Recent Developments in the emerging field of crystalline p-type transparent conducting oxide thin films, Progress in Crystal Growth and Characterization of Materials, 50 (2005), pp. 52-105.

Paul, Biplab, et al., "Nanostructural Tailoring to Induce Flexibility in Thermoelectric Ca3Co4O9 Thin Films"; Applied Materials & Interfaces; ACS Appl. Matter. Interfaces 2017, 9, copyright 2017 American Chemical Society; pp. 25308-25316.

Fu, Guangsheng, et al., "Enhanced transparent conducting performance of c-axis oriented ca3Co4O9 thin films", RSC Advances 2015, 5, copyright 2015 The Royal Society of Chemistry; pp. 26383-26387.

\* cited by examiner

MISFIT P-TYPE TRANSPARENT CONDUCTIVE OXIDE (TCO) FILMS, METHODS AND APPLICATIONS

CROSS-REFERENCE TO RELATED APPLICATION

This application is related to, and derives priority from, International Application No. PCT/US2015/025100 filed 9 Apr. 2015, which claimed priority to U.S. Provisional Patent Application Ser. No. 61/977,419, titled Misfit Transparent Conductive Oxide Films, Methods and Applications, filed 9 Apr. 2014, the contents of which is incorporated herein fully by reference.

STATEMENT OF GOVERNMENT INTEREST

The research that lead to the embodiments as disclosed herein, and the invention as claimed herein, was funded by the United States National Science Foundation under grant number CHE-1152922. Experimental work in accordance with the embodiments and the invention was also undertaken within: (1) the Cornell Center for Materials Research shared facilities as supported by the National Science Foundation MRSEC program under award DMR-1120296; and (2) the Energy Materials Center at Cornell, an Energy Frontier Research Center of the Department of Energy, Office of Science, Office of Basic Energy Sciences, under award DE-50001086. The government has certain rights in the invention.

BACKGROUND

1. Field

Embodiments relate generally to mixed metal oxide materials. More particularly embodiments relate to p-type transparent conductive oxide (TCO) mixed metal oxide materials.

2. Description of the Related Art

One of the most essential components of devices such as solar cells, LCDs, OLEDs, and touch screens is an electrical contact having transparency to visible light. The most commonly used materials for such an electrical contact is a heavily doped, large band-gap metal oxide semiconductor with an n-type charge carrier (e.g., indium tin oxide (ITO)). In contrast with the widespread use of such n-type transparent conducting oxides (TCOs), p-type TCOs have not been as substantially commercially exploited due to their significantly lower carrier mobility and electrical conductivity in comparison with n-type TCOs. High conductivity p-type TCOs could theoretically serve as critical components for various technological developments such as but not limited to: (1) efficient charge injection layers for organic light emitting devices; (2) solar cells with better band matching current collectors; and (3) invisible circuits with oxide p-n junctions that require p-type counterparts to n-type TCOs. Additionally, low cost and scalable manufacturing of p-type TCOs can lead to immediate applications in near infrared optoelectronics where, in comparison, n-type TCOs provide poor optical transmission.

Given a continuing need for p-type TCOs for various applications, desirable are novel and useful p-type TCOs, methods for fabrication thereof and methods for use thereof.

SUMMARY

In light of the foregoing, and in accordance generally with the prophetic embodiments as disclosed below herein, and in particular as illustrative of a specific exemplary embodiment, $Ca_3Co_4O_9$ thin films (and presumably also related non-stoichiometric thin films) synthesized through solution processing are shown to be high-performing, p-type transparent conducting oxides (TCOs). A synthesis method in accordance with the embodiments is a cost-effective and scalable process that relies upon sol-gel chemistry, spin coating and heat treatment. The synthesis method uses a chelating polymer material, but not a block copolymer material. The process parameters can be varied to produce p-type TCO thin films with sheet resistance as low as 5.7 k$\Omega$/sq ($\rho \approx 57$ m$\Omega \cdot$cm) or with average visible range transparency as high as 67% (i.e., in a range from about 50 to about 67%). The most conductive $Ca_3Co_4O_9$ p-type TCO thin film fabricated in accordance with the embodiments has near infrared region optical transmission as high as 85% (i.e., in a range from about 70 to about 85%). A figure of merit (FOM) for the top-performing $Ca_3Co_4O_9$ thin film (151 M$\Omega$-1) is higher than FOM values reported for other solution processed p-type TCO thin films, as well as other p-type TCO films prepared by PVD and CVD.

As a prophetic extension of the $Ca_3Co_4O_9$ and related non-stoichiometric thin film embodiments described above also contemplated are alternative mixed metal oxide p-type TCOs in accordance with the general chemical composition $M1_xM2_yO_z$ wherein: (1) M1 is at least one metal selected from the group consisting of alkali metals, alkali earth metals and post transition metals that are lighter than radon; (2) M2 is at least one metal selected from the group consisting of transition metals that are lighter than radon; further wherein: (a) when x is normalized to unity y ranges from 0.2 to 5.0, including stoichiometric and non-stoichiometric compositions; and (b) z is determined consistent with x and y, considering oxidation states of M1 and M2.

Specific options for M1 and M2 within the above general chemical composition are enumerated below within the General Considerations section of the Detailed Description of the Non-Limiting Embodiments.

The embodiments also contemplate methods for fabricating mixed metal oxides in accordance with the embodiments. The methods comprise sol-gel methods that use a chelating polymer but not a block co-polymer to assist in at least partial crystallization of a p-type TCO mixed metal oxide in accordance with the embodiments absent any epitaxial crystallization of the mixed metal oxide material with respect to a substrate upon which is located and formed the p-type TCO mixed metal oxide material.

As noted above, the embodiments utilize a chelating polymer, but not a block copolymer material, to sufficiently sequester M1 and M2 ions so that the M1 and M2 ions can freely organize into a misfit structure absent any influence from a substrate upon which is located and formed a p-type TCO mixed metal oxide material layer in accordance with the embodiments. Thus, with respect to a substrate upon or over which is formed a p-type mixed metal oxide layer in accordance with the embodiments, such a substrate may be substantially opaque (i.e., less than about 25 percent transmittance), partially transparent (from greater than about 25 percent to less than about 75 percent transmittance) or substantially transparent (i.e., greater than about 75 percent transmittance). Additionally, such a substrate may comprise a material selected from the group including but not limited to dielectric materials, semiconductor materials and conductor materials. Finally, such a substrate may comprise either a substantially non-crystalline material (i.e., having a crystalinity less than about 25 percent), a partially crystalline material (i.e., having a crystallinity greater than about 25 to less than about 75 percent) or a completely crystalline material (i.e., having a crystallinity greater than about 75 percent).

Within the disclosure and also within the claims, the terminology "without an epitaxial relationship with respect to the substrate" is intended to indicate that a chemical composition in accordance with the embodiments does not replicate in three dimensions a crystal structure of a substrate upon which is located and formed the chemical composition.

Within the disclosure and also within the claims, the terminology "over" is intended to designate at least a partial vertical alignment of one structural component with respect to another structural component, but not necessarily a contact of the one structural component and the other structural component.

Within the disclosure and also within the claims, the terminology "upon" is intended to designate at least a partial vertical alignment of one structural component with respect to another structural component, but with contact of the one structural component with the other structural component.

A particular structure in accordance with the embodiments includes a substrate. This particular structure also includes an at least partially crystalline p-type mixed metal oxide material having a chemical composition $M1_xM2_yO_z$ and located upon the substrate without an epitaxial crystalline relationship with respect to the substrate.

Another particular structure in accordance with the embodiments includes a substrate. This other particular structure also includes an at least partially crystalline non-stoichiometric p-type mixed metal oxide material having a chemical composition $Ca_xCo_yO_z$ and located upon the substrate without an epitaxial crystalline relationship with respect to the substrate, wherein: (1) when x is normalized to unity y ranges from about 1.2 to about 1.5; and (2) z is selected consistent with x and y, considering the oxidation states of Ca and Co.

Yet another particular structure in accordance with the embodiments includes a substrate. This other particular structure also includes an at least partially crystalline p-type mixed metal oxide material having a chemical composition $Ca_3Co_4O_9$ and located upon the substrate without an epitaxial crystalline relationship with respect to the substrate.

A particular method in accordance with the embodiments includes mixing within a solvent material at least an M1 metal oxide precursor material and an M2 metal oxide precursor material different from the M1 metal oxide precursor material with a chelating polymer material that is not a block copolymer material to provide at least an M1/M2 chelated polymer material. This particular method also includes sequentially desolvating and calcining the at least the M1/M2 chelated polymer material to provide a mixed metal oxide material of chemical composition $M1_xM2_yO_z$.

Another particular method in accordance with the embodiments includes mixing within a solvent material at least a calcium metal oxide precursor material and at least a cobalt metal oxide precursor material with a chelating polymer material that is not a block copolymer material to provide at least a calcium and cobalt chelated polymer material. This other particular method also includes sequentially desolvating and calcining the calcium and cobalt chelated polymer material to provide a calcium and cobalt mixed metal oxide material of chemical composition $Ca_xCo_yO_z$ wherein: (1) when x is normalized to unity y ranges from 1.2 to 1.5, including non-stoichiometric compositions; and (2) z is selected consistent with x and y, considering oxidation states of calcium and cobalt.

Yet another particular method in accordance with the embodiments includes mixing within a solvent material at least a calcium metal oxide precursor material and at least a cobalt metal oxide precursor material with a chelating polymer material that is not a block copolymer material to provide at least a calcium and cobalt chelated polymer material. This other particular method also includes sequentially desolvating and calcining the calcium and cobalt chelated polymer material to provide a calcium and cobalt mixed metal oxide material of chemical composition $Ca_3Co_4O_9$.

BRIEF DESCRIPTION OF THE DRAWINGS

The objects, features and advantages of the embodiments are understood within the context of the Detailed Description of the Non-Limiting Embodiments, as set forth below. The Detailed Description of the Non-Limiting Embodiments is understood within the context of the accompanying drawings, which form a material part of this disclosure, wherein.

DETAILED DESCRIPTION OF THE NON-LIMITING EMBODIMENTS

Figure 1:
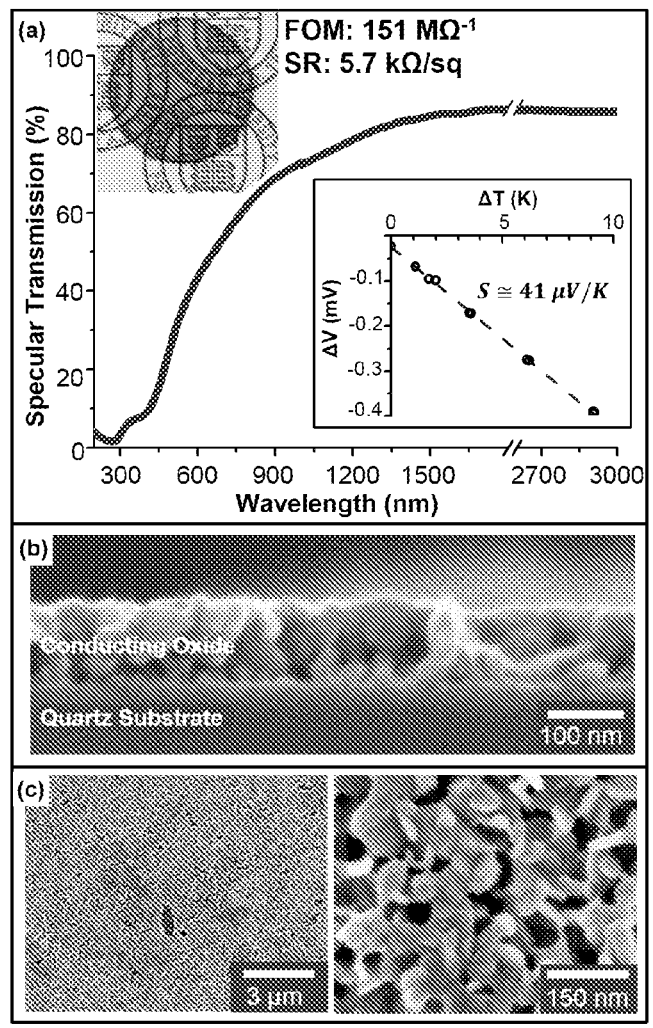
FIG. 1 shows measurements of a transparent conducting oxide (TCO) thin film of p-type $Ca_3Co_4O_9$ obtained by spin coating and calcination of a viscous resin on a quartz substrate. The figure of merit (FOM) value for the $Ca_3Co_4O_9$ TCO thin film is significantly higher than the FOM values of other solution processed p-type TCO thin films in literature and even higher than FOM values of PVD or CVD prepared films. (a) Specular optical transmission of the TCO thin film between photon wavelengths of 250 nm and 3000 nm. The inset camera image at the top left shows the TCO thin film on a paper with printed logos. FOM and sheet resistance (SR in the figure) values for the TCO thin film are 151 M$\Omega^{-1}$ and 5.7 k$\Omega$/sq, respectively. The inset graph at bottom right is in-plane Seebeck measurement of the film, indicating a positive Seebeck coefficient of ~41 µV/K (p-type conductivity). (b) Cross-sectional SEM image of the $Ca_3Co_4O_9$ thin film in (a) showing film thickness of ~100 nm. (c) Low (left) and high (right) magnification surface SEM images of the TCO thin film. The film is smooth and homogenous with nanometer scale voids and sparse micrometer scale cracks (left). The length of the nano-plates in the TCO film is ~50-100 nm (right).

Since the pioneering work on thin films of delafossite $CuAlO_2$, p-type TCOs have been vigorously researched with the goal of creating invisible circuits. To date, a material with a comparatively high conductivity among p-type TCOs is $CuCr_{1-x}Mg_xO_2$, with conductivity of 220 S/cm and visible range transparency of 30-40%. However, thin film manufacturing routes in the majority of these studies have been restricted to CVD and PVD techniques. These methods are more expensive and less scalable than solution-based techniques, which are simpler and faster. Solution-based synthesis techniques, so far, have provided only limited success for p-type TCO thin films, with performance hampered by low conductivity, induced from non-uniformity and excessive porosity. Until now, the highest p-type conductivity from solution-based techniques is only ~1 S/cm.

In light of the foregoing, embodiments provide p-type TCO materials that are formed using solution methods, and with enhanced optical transparency within the optical wavelength range.

I. General Considerations and Extensions for p-Type Mixed Metal Oxide TCO Materials Although the experimental embodiments as discussed below are described within the context of a specific p-type $Ca_3Co_4O_9$ mixed metal oxide material that may be prepared using a sol-gel method, the embodiments need not necessarily be so limited. Rather the embodiments are generally and prophetically expected to be applicable within the context of a mixed metal oxide material comprising a chemical composition $M1_xM2_yO_z$ wherein: (1) M1 is at least one metal selected from the group consisting of alkali metals, alkali earth metals and post transition metals that are lighter than radon; (2) M2 is a least one metal selected from the group consisting of transition metals that are lighter than radon; further wherein: (a) when x is normalized to unity y ranges from 0.2 to 5.0, including stoichiometric and non-stoichiometric compositions; and (b) z is determined consistent with x and y, considering oxidation states of M1 and M2.

Within the context of the foregoing chemical composition: (1) M1 as an alkali metal includes at least one of lithium, sodium, potassium, rubidium (to a lesser extent) and cesium (to a lesser extent); (2) M1 as an alkali earth includes at least one of beryllium (to a lesser extent), magnesium, calcium, strontium and barium (to a lesser extent); and (3) M1 as a post transition metal lighter than radon includes at least one of copper aluminum, bismuth and zinc. Similarly, M2 as a transition metal lighter than radon includes at least one of chromium, nickel, cobalt, iron, manganese, ruthenium and rhodium Within the context of the foregoing description the more extended embodiments also consider a method for preparing a mixed metal oxide material including: (1) mixing within a solvent material at least an M1 metal oxide precursor material and at least an M2 metal oxide precursor material with a chelating polymer material and not a block copolymer material to provide at least an M1/M2 chelated polymer material; and (2) subsequently and sequentially desolvating and calcining the M1/M2 chelated polymer material to provide a mixed metal oxide material of chemical composition $M1_xM2_yO_z$ wherein: (a) M1 is at least one metal selected from the group consisting of alkali metals, alkali earth metals and post transition metals that are lighter than radon; (b) M2 is a least one metal selected from the group consisting of transition metals that are lighter than radon; further wherein: (1) when x is normalized to unity y ranges from 0.2 to 5.0, including stoichiometric and non-stoichiometric compositions; and (2) z is selected consistent with x and y, considering oxidation states of M1 and M2.

Within the foregoing method M1 and M2 are the same materials as designated above within the context of the related chemical composition material. Within the context of the embodiments, any of several chelating polymers may be used, including but not limited to polyacrylic acid chelating polymers, polyacrylate chelating polymers, polyamine chelating polymers, polyammonium chelating polymers and polyhydroxy chelating polymers. Notable within the embodiments is that the embodiments do not use a chelating block copolymer, or any other type of block copolymer which will otherwise provide for formation of an ordered porous array within an $M1_xM2_yO_z$ chemical composition that results from overall method in accordance with the embodiments.

Within the embodiments, the mixing of the M1 and M2 starting materials may be undertaken in a solvent including but not limited to an aqueous or an alcoholic solvent to yield a total M1 and M2 concentration from about 0.04 to about 5.0 molar and preferably from about 0.05 to about 5.0 molar. The M1 and M2 starting materials comprise salts including but not limited to halide, nitrate, acetate and sulphate salts of appropriate M1 and M2 starting materials.

Within the embodiments the desolvating is undertaken at a temperature from about 20 to about 180 degrees centigrade and preferably from about 100 to about 150 degrees centigrade.

Within the embodiments, the calcining is undertaken at a temperature from about 400 to about 900 degrees centigrade and more preferably from about 550 to about 750 degrees centigrade.

Within the embodiments under relatively low scanning electron microscopy (SEM) magnification of about 500 to about 2000 fold, a scanning electron microscopy image of a chemical composition in accordance with the embodiments (see, e.g., FIG. 1c (left)) shows a generally smooth sand like surface with some granularity and occasional cracks that occupy less than about 5 area percent of the SEM image surface.

Within the embodiments, an x-ray diffraction spectrum of a chemical composition in accordance with the embodiments (see, e.g., FIG. 3a) shows no greater than five resonances within a 2$\Theta$ position range of 10 to 40 degrees.

II. Specific Considerations for an Experimentally Embodied $Ca_3Co_4O_9$ p-Type TCO In this particular exemplary embodiment, a scalable and cost-effective embodied manufacturing technique is reported for fabricating a nanostructured, p-type TCO thin film of $Ca_3Co_4O_9$. Homogenous, p-type TCO thin films with 5.7 k$\Omega$/sq sheet resistance ($R_s$) and ~100 nm thickness (t) (corresponding to a conductivity of $\sigma=1/(R_s t)\approx 18$ S/cm) can be obtained by the embodied simple method that is based on sol-gel chemistry and spin coating. The average visible range optical transparency for the films can be varied from 31% to 67%, with a concomitant change in conductivity. One may observe very high optical transmission in the near infrared region, reaching up to 85% for an embodied most conductive TCO film. $Ca_3Co_4O_9$ is a misfit-layered oxide with two alternating monoclinic subsystems (rock salt-type $Ca_2CoO_3$ and $CdI_2$-type $CoO_2$) that have identical lattice parameters for the a and c axes but different lattice parameters for the b axis. Although $Ca_3Co_4O_9$ has been very well known as a remarkable p-type thermoelectric material, with properties such as high in-plane conductivity ($\sigma_{ab}$>500 S/cm) and Seebeck coefficient ($S_{ab}$>120 $\mu$V$K^{-1}$), superior optoelectronic properties of $Ca_3Co_4O_9$ have not been reported previously, and transparent conductivity has not been observed in misfit layered oxides.

The synthetic method for the transparent conducting thin films of calcium cobalt oxide employs the Pechini method, in which an organic chelating agent dissolves metal precursors in an appropriate solvent. The resulting homogenous liquid solution is then evaporated into a viscous resin that is spun coated on quartz substrates prior to in-furnace calcination. One may modify the Pechini method to polymerically entrap the metal ions in aqueous solutions by using poly(acrylic acid) (PAA, average molecular weight=$M_w$~1800) as the chelating agent. Appropriate quantities of PAA, cobalt(II) nitrate hexahydrate and calcium nitrate tetrahydrate were dissolved in deionized water at room temperature. Concentrations of each of the metal salts in the solution were 0.205 M, providing a Ca to Co ratio of 1:1. The ratio of PAA carboxylate groups to total metal ions is 2:1, resulting in a total solute concentration of 1.23 M, considering the number of PAA monomers and metals salts in the solution. The solution was evaporated at 150° C. with continuous stirring until it reached the desired solute concentration, forming a viscous resin. As the solution was evaporated, it is believed that chelating groups on the ligand stabilize the metal cations in the solution through dipole forces between water molecules and metal ions, and by the physical tangling and cross-linking of polymer chains which can trap both the solvent and cations in a drying sheet of polymer-metal ion complex. The solute concentration in the resin was adjusted by controlling the evaporated solvent volume. Evaporating the solution to 50% 40%, 35%, and 30% of the initial solution volume resulted in total solute concentrations of 2.5, 3.1, 3.5 and 4.1 M (±3% error), respectively. The evaporated resin was spin coated on 1 inch diameter polished quartz substrates at 6000 rpm. The solution was injected from a syringe in a continuous stream for <2 seconds onto the quartz substrate. Spin rates lower than 6000 rpm resulted in notably more inhomogeneous resin coatings in terms of transparency and color. In order to eliminate the water content and organic species in the coated films, the samples are baked under vacuum at 80 and 150° C. consecutively for 2 hours each and then in air at 150° C. for another 2 hours. Setting the initial baking temperature to 80° C. prevents rapid outgassing of the water content preventing bubble and crack formation on the coated films. Similarly, the vacuum environment reduces the burning rate of the organic content resulting in slower outgas sing of combustion products. The vacuum environment also speeds the time required for the low temperature outgassing of water. In the second step, the temperature was raised to 150° C. because this temperature is typically needed for outgassing of C content from PAA and N content from metal salts. Introducing air in the last baking step ensures complete burning and outgassing of the remaining N and C content. The resin films were then calcined at 650° C. in a preheated box furnace for 5, 15, 25, or 35 minutes. The samples were covered by crucibles during calcination in order to avoid undesired radiative heating of the sample surface.

Specular optical transmissions and sheet resistances of calcium cobalt oxide thin films were measured to evaluate the TCO properties. A linear array, four-point probe is used for sheet resistance measurements. Sheet resistances of TCO films were determined by averaging 12 equally spaced measurements along two perpendicular lines passing through the center of the circular sample. The measurements were limited to locations that were within 8 mm from the center of the sample to avoid edge effects. Optical transmission measurements were performed using a Shimadzu UV3600 UV-Vis spectrometer and an Ocean Optics USB2000+VIS-NIR spectrometer, with an uncoated quartz disc used as a reference for these measurements. The optical transmission was measured through a ~5×15 mm rectangular area close to the center of the sample. Optical transmission though two different areas on the same sample were typically within 1% of each other. Because the high optical transmission and electrical conductivity are conflicting properties, the transparent conducting films were evaluated based on their FOM F=−1/($R_s$×ln T) where $R_s$ is the sheet resistance and T is the optical transmission.[16] One may calculate FOM based on optical transmission in the visible range by averaging transmission values at photon energies of 1.77, 2, 2.25, 2.5, 2.75, and 3 eV.

Figure 4:
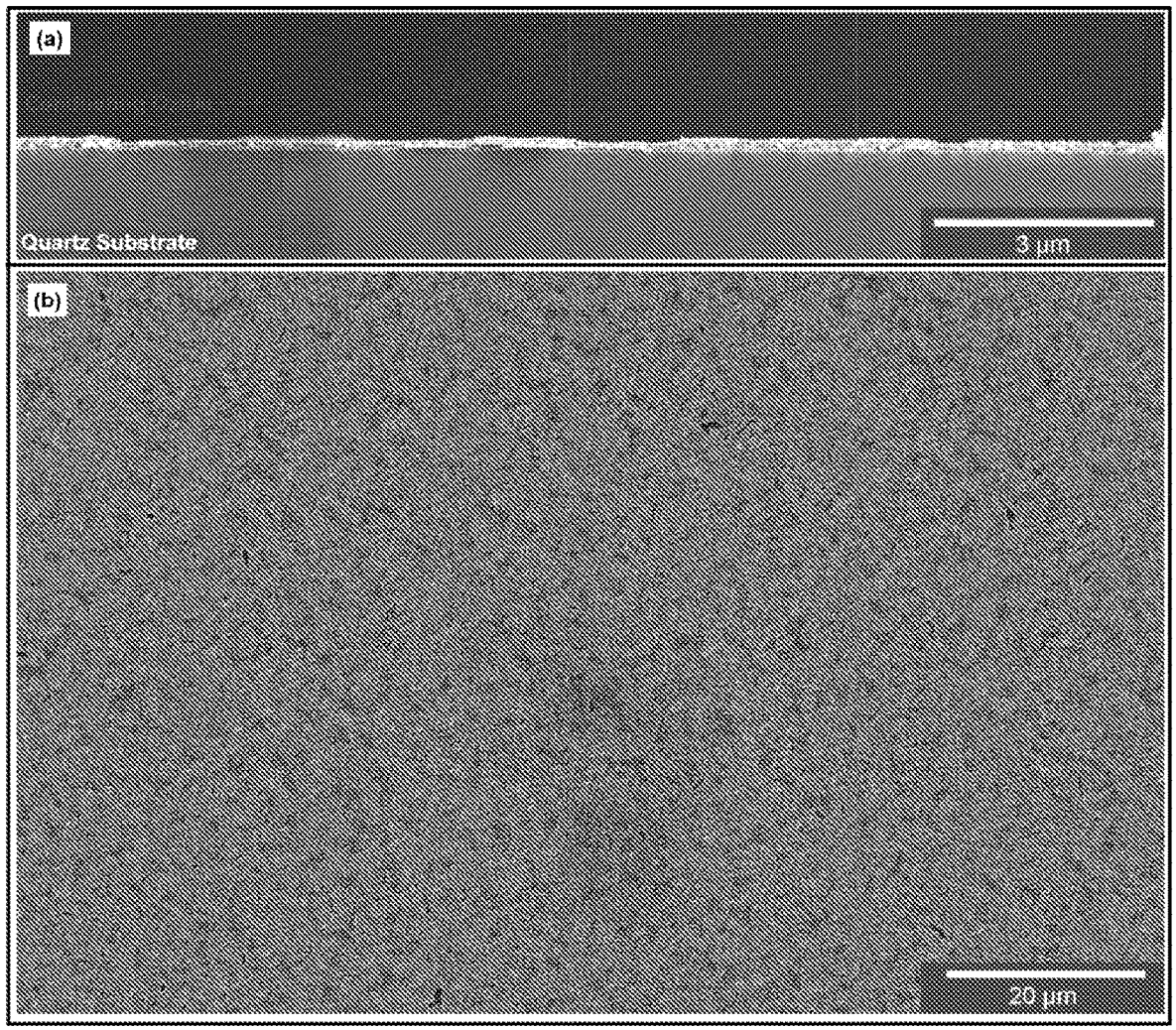
FIG. 4 shows low magnification SEM images of the TCO thin film in the main text FIG. 1. (a) Low magnification cross-sectional image of the TCO thin film showing long range uniformity. (b) Low magnification surface image of the TCO thin film showing the long range smoothness and occasional micron-scale cracks.

The highest FOM was found for the TCO thin films of calcium cobalt oxide when a 3.5 M total solute concentration resin is used and the film was calcined for 25 minutes at 650° C. FIG. 1(a) shows the specular optical transmission of the high FOM thin film between photon wavelengths of 200 and 3000 nm. The optical transmission increases with increasing photon wavelength ranging from 8.9% to 53.7% at the lower and higher edges of the visible range (400 and 700 nm, respectively). The optical transmission was significantly enhanced in the near infrared region, reaching up to 85% for photon wavelengths longer than ~1.5 $\mu$m. The film had visibly homogenous transparency with translucent brown color (FIG. 1(a), top left inset). The average photon transmission in the visible range and the sheet resistance ($R_s$) for the film were 31.3% and 5.7 kΩ/sq, respectively, resulting in a FOM of 151 MΩ$^{-1}$. Voltage and temperature differences (ΔV and ΔT) were measured between two points on the thin film at room temperature in order to find the Seebeck coefficient (FIG. 1(a), bottom right inset). The temperature difference between the two points was induced by a resistive heater at the hot point while the cold point remained at room temperature. The data points in the ΔV vs. ΔT plot fit to a line (FIG. 1(a), bottom right inset, open black circles and dashed blue line, respectively), with a negative slope indicating a positive Seebeck coefficient of $$S = -\frac{\Delta V}{\Delta T} \cong 41 \ \mu V/K$$

and p-type conductivity. The FOM value for the p-type TCO thin film in FIG. 1 was significantly higher than the FOM values of all other solution processed p-type TCO thin films previously reported and even higher than FOM values of most PVD and CVD prepared films. The thickness of the TCO thin film was ~100 nm according to a cross-sectional SEM (FIG. 1(b) and FIG. 4(a)) and 106 nm as measured by contact profilometry. The contact profilometry measurements performed on the film surface over 1 mm length with 1 μm lateral resolution indicated that the standard deviation in the film height was 16 nm. Surface SEM images show that the film consisted of nano-porous network of ~50-100 nm long nano-plates (FIG. 1(c), right) and the film was mostly smooth and homogenous with occasional micron-scale cracks (FIG. 1(c), left and FIG. 4(b)). These micron-scale cracks formed during calcination, mostly likely due to grain growth by coalescence of crystals. Assuming ~100 nm thickness, the electrical conductivity of the TCO thin film could be calculated as σ=1/(R$_s$t)≈18 S/cm (resistivity, ρ≈57 mΩcm). This conductivity was more than 25 times lower compared to in-plane conductivities previously reported for single crystalline $Ca_3Co_4O_9$ (>500 S/cm). A plausible reason for the reduction in conductivity is the nanoporous and nanocrystalline microstructure of the film that reduces the effective cross-sectional area for electrical conduction and introduces contact resistance between the $Ca_3Co_4O_9$ crystals. The micron scale cracks in the film could also reduce the specular optical transmission due to scattering of light, therefore, elimination of such defects should improve the optical transmission and FOM of the film. The nanoporous and nanocrystalline microstructure of the film were unlikely to cause significant optical scattering because the pore and crystal sizes were significantly shorter than the visible light wavelengths (FIG. 1(c)).

Figure 2:
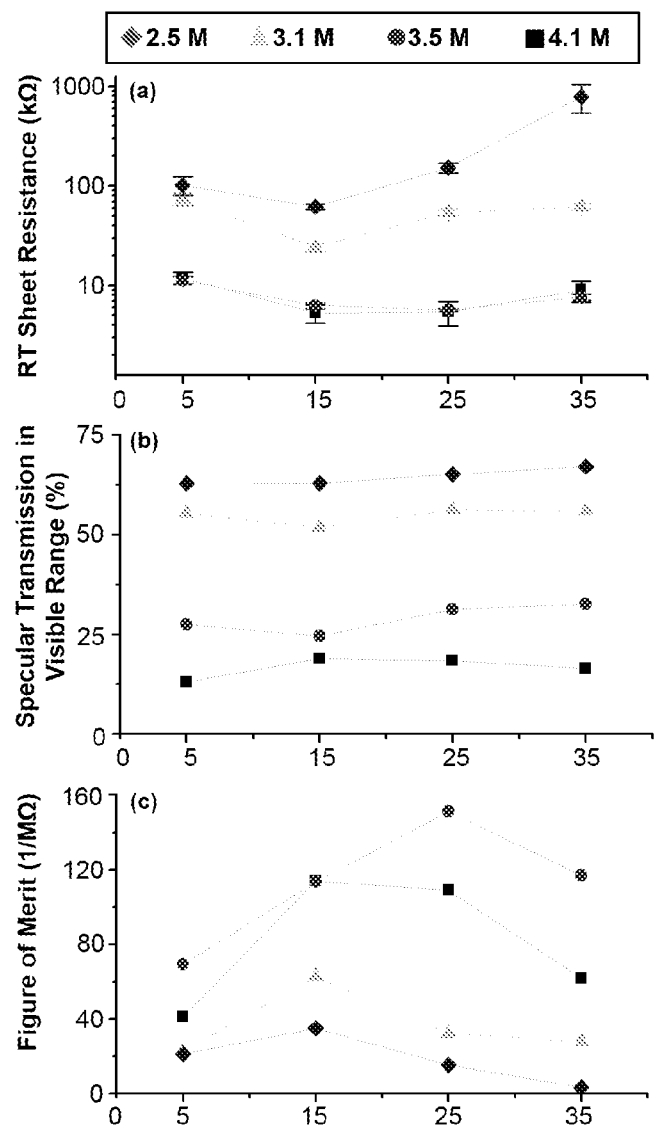
FIG. 2 shows sheet resistance, specular optical transmission and FOM values for $Ca_3Co_4O_9$ TCO thin films obtained with different solute concentrations and calcination times. Data points for the solute concentrations of 2.5, 3.1, 3.5, and 4.1 M are represented in color by blue diamond, green triangle, red circle, and black square symbols, respectively (or alternatively by diamond, triangle, circle and square symbols, respectively). (a) Average sheet resistance values were obtained from 12 measurements on each TCO film vs. calcination time. The error bars are based on standard deviation in different sheet resistance values on each TCO film. (b) Average specular optical transmission of the TCO thin films in visible range vs. calcination time. (c) FOM values were calculated based on average sheet resistances and specular optical transmissions in visible range.
Figure 6:
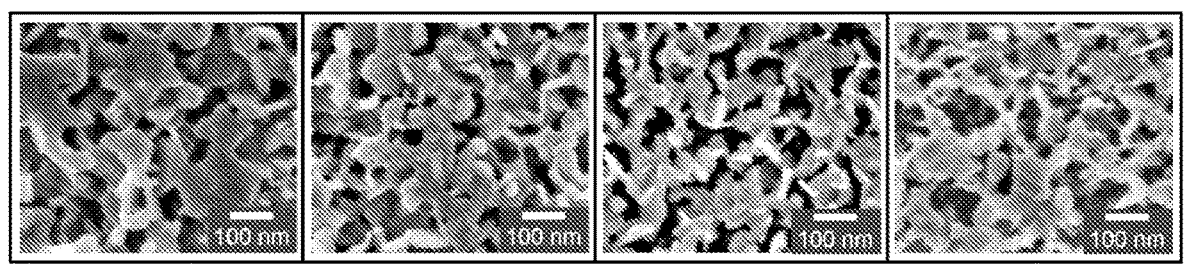
FIG. 6 shows surface SEM images of TCO films made from resins with different solute concentrations. All of the films are calcined at 650° C. for 25 minutes. The thin films are made from resins with solute concentrations of (a) 4.1 M, (b) 3.5 M, (c) 3.1 M and (d) 2.5 M
Figure 7:
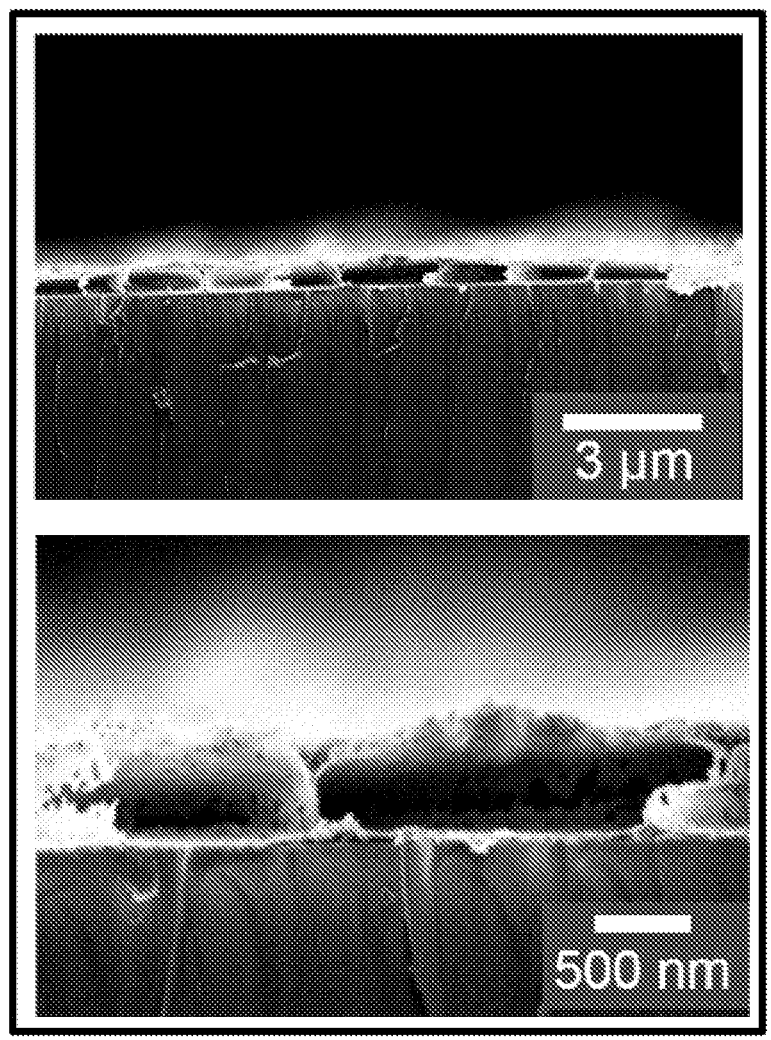
FIG. 7 shows cross-sectional SEM images of the $Ca_3Co_4O_9$ thin film prepared from 4.1 M solute concentration resin after 15 minutes calcination at 650° C.

Decreasing the resin solute concentration to less than 3.5 M significantly increased sheet resistance and optical transmission of the calcined TCO thin films. In FIG. 2, sheet resistances, average specular optical transmissions in the visible range, and FOM values are plotted against calcination times for all $Ca_3Co_4O_9$ TCO thin films obtained from different solute concentrations (see FIG. 8(a) for optical transmission spectrum of the 15 minute calcined films). Sheet resistance values are reported with error bars (FIG. 2(a)), which correspond to the standard deviation from the 12 sheet resistance measurements performed on each film. Both optical transmission and sheet resistance significantly increased with decreasing solute concentration for the TCO thin films that were prepared from 2.5, 3.1, and 3.5 M solute concentration resins (FIG. 2(a)). This trend was most likely due to decreasing film thickness (t) since both optical transmission and sheet resistance increased with decreasing t as expressed by T=e$^{-\alpha t}$ and R$_s$=1/(σt) respectively (assuming fixed ∝ and σ). After 15 minutes calcination, the thicknesses of the TCO thin films that were prepared from 3.5, 3.1, and 2.5 M solute concentration resins were 108±23, 85±9, and 49±5 nm, respectively, as measured by contact profilometry over a 1 mm length with 1 μm lateral sampling. This decrease in the film thickness with decreasing solute concentration was reasonable as low solute concentration resins have visibly lower viscosity, resulting in thinner films after spin coating and calcination. Another reason for the increasing sheet resistance with decreasing solute concentration can also be associated with high porosity of the samples made with low solute concentration. Lower metal concentrations are expected to result in higher porosity as the water and organics are eliminated during baking (See FIG. 6 for surface SEM images of TCO films made from different solute concentration resins).

Figure 5:
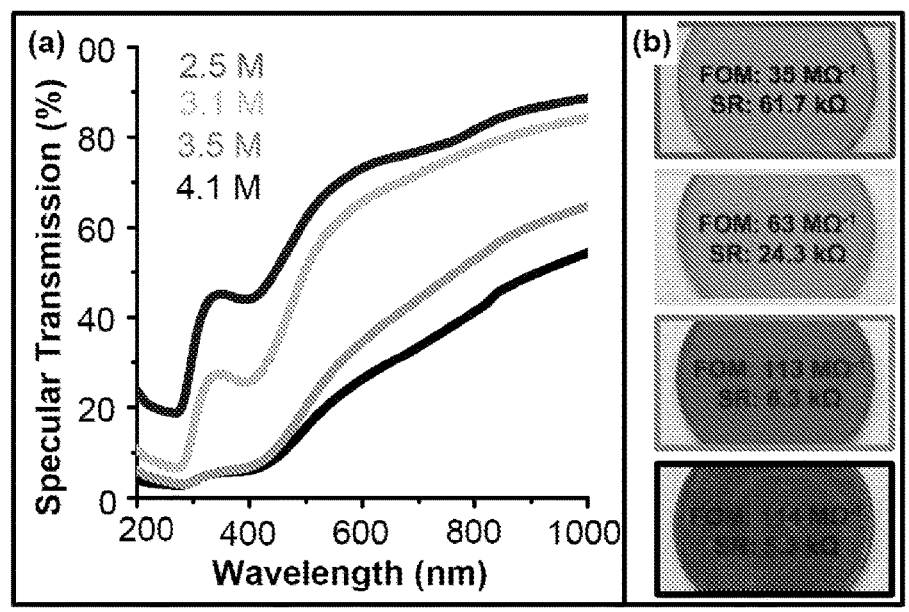
FIG. 5 shows transparent conductive oxide (TCO) thin films of p-type $Ca_3Co_4O_9$ obtained from viscous resin intermediates with different solute concentrations. All of the TCO films in this figure are calcined at 650° C. for 15 minutes. Different solute concentrations of 2.5 M, 3.1 M, 3.5 M and 4.1 M are indicated with blue, green, orange and black colors (i.e., from top bottom) respectively. (a) Optical transmission measurements of the TCO thin films. (b) Camera images showing the $Ca_3Co_4O_9$ thin films in (a) on white paper with FOM and sheet resistance (SR) values written under the samples.

Decreasing the solute concentration from 3.5 to 3.1 M and from 3.1 to 2.5M caused up to a ~9.5× and a ~12.8× increase in the sheet resistance, respectively. The difference in sheet resistance between the 4.1 and 3.5 M samples was negligible (within the error limits) (FIG. 2(a)). This negligible change in the sheet resistance for these two concentrations (4.1 and 3.5 M) was likely due to the low quality of the 4.1 M films in terms of homogeneity and uniformity. The coefficients of variation in the 12 sheet resistance measurements performed on 15 minute calcined thin films are 0.06, 0.09, 0.07 and 0.21 in order of increasing solute concentration. This revealed that the 4.1 M sample was significantly more inhomogeneous compared to the others in terms of sheet resistance. The 4.1 M sample was also visibly inhomogeneous in terms of color and transparency, unlike the other films (See FIG. 5(b) for camera images of the 15 minute calcined films). SEM images indicate that the film prepared from 4.1 M solute concentration resin was non-uniform and not very well attached to the substrate.

Figure 8:
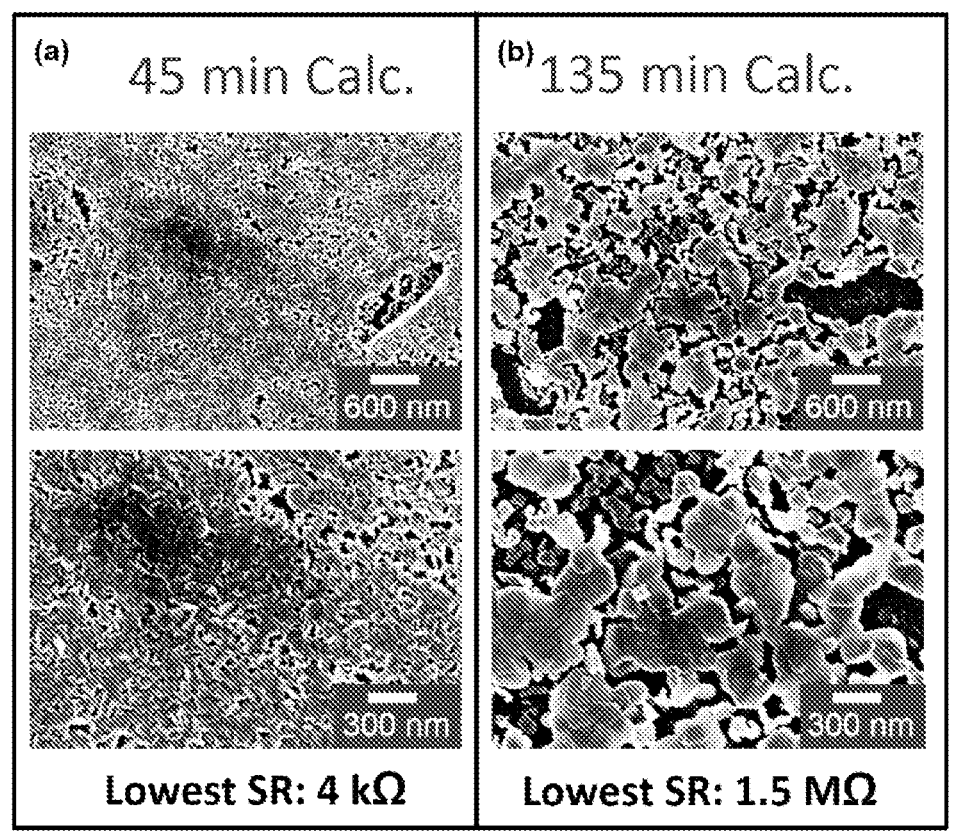
FIG. 8 shows SEM images of two $Ca_3Co_4O_9$ thin films that are calcined for (a) 45 and (b) 135 minutes at 650° C. Both films are prepared from same solute concentration resin. The lowest sheet resistance values measured on the films are 4 kΩ and 1.5 MΩ respectively for (a) and (b).

For all solute concentrations except 3.5 M, the lowest sheet resistances were observed at 15 minutes calcination and the sheet resistance gradually increased as calcination time increased past 15 minutes. For the 3.5 M solute concentration the sheet resistance gradually reached the lowest value at 25 minutes calcination and increased again at 35 minutes calcination (FIG. 2(a)). The high sheet resistance at 5 minutes calcination of the thin films was likely due to incomplete crystallization of the metallic species into the highly conductive $Ca_3Co_4O_9$ phase. The increase in the sheet resistance as calcination times approached 35 minutes is likely due to coalescence of $Ca_3Co_4O_9$ crystals, which break the electrical connections between the particles. SEM images showed obvious coalescence of $Ca_3Co_4O_9$ crystals after 135 minutes of calcination in comparison with the TCO film calcined for 45 minutes, and a concomitant increase in sheet resistance by 2-3 orders of magnitude comparing the 45 and 135 minutes calcination time samples (FIG. 8). The film obtained from the 3.5 M solute concentration resin at 25 minutes calcination had the lowest sheet resistance among all of our TCO thin film samples (sheet resistance 5.7 kΩ/sq, ρ≈57 mΩcm). This same film showed the best spatial homogeneity in terms of sheet resistance, with a coefficient of variance of 0.03 in the 12 sheet resistance measurements performed on different locations on the film.

Optical transmission, interestingly, did not vary greatly across calcination times (FIG. 2(b)). However, transmission markedly increased as precursor concentration decreased. The highest visible range optical transmission (67% in average) was measured for the film obtained from the 2.5 M solute concentration after 35 minutes calcination.

The optimum transparent conductive properties were obtained when the baked films were calcined for 15 minutes (2.5, 3.1, and 4.1 M concentration) or 25 minutes (3.5 M). FOM values calculated from the sheet resistances and optical transmissions (FIGS. 2(a) & 2(b)) were plotted in FIG. 2(c). The FOM increased as the calcination time was increased from 5 minutes to 15 minutes for the 2.5, 3.1, and 4.1 M samples, and decreased as the calcination time increased further. For the 3.5 M sample the FOM peaked at 25 minutes calcination. The FOM increased as the solute concentration increased at all calcination times for solute concentrations 2.5, 3.1, and 3.5 M, but the highest solute concentration (4.1 M) showed a decreased FOM below the 3.5 M sample's values. The FOM was highest for the film with lowest sheet resistance (3.5 M solute concentration and 25 minutes calcination) and lowest for the film with highest optical transmission (2.5 M solute concentration and 35 minutes calcination).

Figure 3:
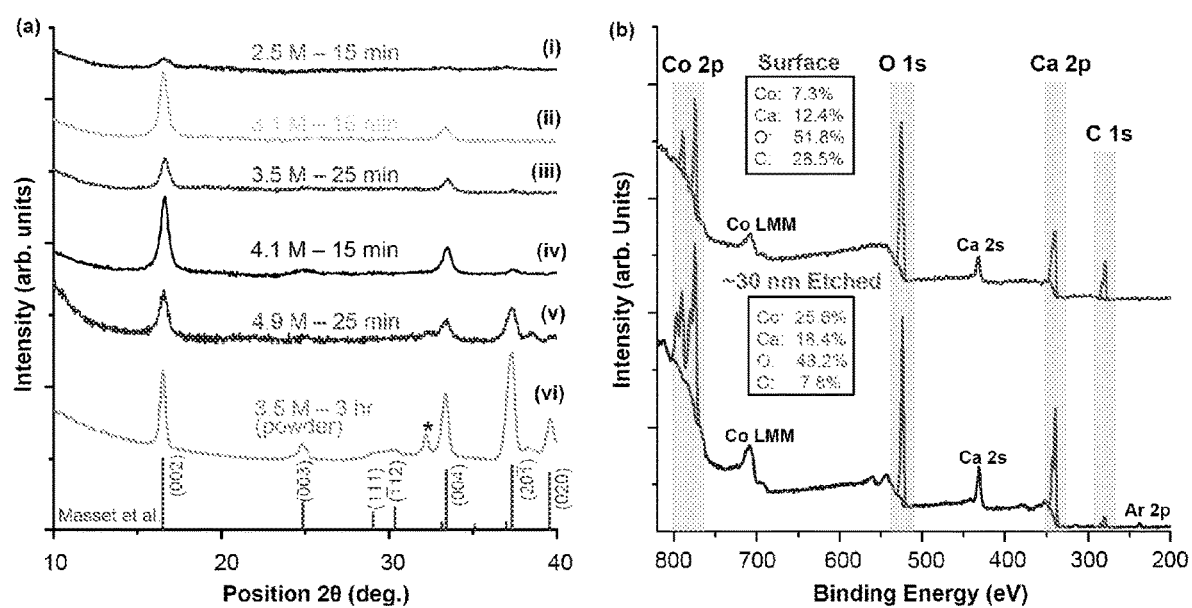
FIG. 3 shows XRD and X-ray Photoelectron Spectroscopy (XPS) of TCO thin films. (a) XRD for six $Ca_3Co_4O_9$ TCO thin film samples (i-v) and $Ca_3Co_4O_9$ powder (vi). The reference peak positions for $Ca_3Co_4O_9$ phase are shown with vertical (red or gray) lines. The peak in powder sample (vi) denoted by asterisk (*) is likely to have originated from a CaO impurity. (b) XPS of the top-performing TCO thin film (3.5 M solute conc., 25 min calc.). The Co 2p, O 1s, Ca 2p, and C 1s peaks are evaluated for elemental analysis (indicated by green bands which are light gray in grayscale). XPS is taken on the film surface (upper red curve) and after etching ~30 nm into the film (blue curve). Subtracted backgrounds are shown with black curves. Atomic percentages are listed in the inset tables.

X-ray diffraction (XRD) patterns obtained from the TCO thin films could be indexed by assuming $Ca_3Co_4O_9$ crystalline structure. FIG. 3(a) shows XRD patterns for four top-performing TCO thin films (solute resins concentrations: 2.5, 3.1, 3.5, and 4.1 M; calcined at 650° C. for 15 or 25 minutes) and another TCO thin film that is prepared from 4.9 M solute concentration resin and calcined at 650° C. for 25 minutes (FIG. 3(a)(i-v)). Notable is that the XRD spectrum of FIG. 3(a)(i-v) is the limited number of XRD peaks, generally less than 5 peaks or 4 peaks, and as low as 1 peak. For comparison, FIG. 3(a) also includes the XRD pattern of calcium cobalt oxide powder that are obtained by direct calcination of the 3.5 M solute concentration resin at 650° C. for 3 hours (FIG. 3(a)(vi)). The resin solute concentrations and calcination times are indicated next to the XRD patterns. In XRD measurements of the films the scattering vector (Q) is aligned perpendicular to the quartz substrate. The wide background peak from the quartz substrate is separately measured and subtracted from all of the TCO thin film XRD patterns. The XRD pattern for the powder obtained from the calcination of the 3.5 M solute concentration resin (FIG. 3(a)(vi)) matched with most of the reference peaks (FIG. 3(a) vertical bars at bottom) for the $Ca_3Co_4O_9$ phase. The asterisk (*) marked peak of the powder matched the (111) peak of CaO phase (PDF #004-0777), which can form as an impurity due to excess Ca in the resin. The XRD pattern of the TCO films prepared from a 4.1 and 4.9 M solute concentration resin have (002), (004) and (201) peaks matched with the $Ca_3Co_4O_9$ reference (FIG. 3(a)(iv-v)). The XRD patterns for the other TCO thin films in FIG. 3(a) clearly show two (00L) peaks from the $Ca_3Co_4O_9$ reference (FIG. 3(a)(i-iii)). The absence of peaks other than the (00L) planes indicates texturing of the $Ca_3Co_4O_9$ crystals, with alignment of the c-axis perpendicular to the substrate. Considering the number of peaks from different crystal planes, the XRD patterns from the 4.1 and 4.9 M samples are a transition between the randomly oriented crystals of the powder form and the c-axis oriented crystals of the top-performing TCO thin films. This is probably due to extreme non-uniformity and excessive peeling of the TCO films prepared from the more viscous 4.1 and 4.9 M solute concentration resins. The peak from the CaO phase did not appear in the TCO thin film XRD patterns probably due to diffusion of excess Ca in the resin to the glass substrate. Scherrer analysis of the (002) peak from the film with the highest FOM (3.5 M solute concentration and 25 minutes calcination, FIG. 3(a)(iii)) indicated that the average crystal size was ~22 nm along the [00L] direction. The film obtained from the 2.5 M solute concentration resin at 15 minutes calcination only showed a weak (002) peak that matched with the $Ca_3Co_4O_9$ phase (FIG. 3(a)(i)).

XPS was performed on the top-performing TCO thin film (3.5 M concentration, 25 minutes calcination) (FIG. 3(b)). XPS was measured at the film surface (FIG. 3(b), red curve) and after removing the upper ~30 nm of surface by Ar-ion milling (FIG. 3(b), blue curve). The Co 2p, Ca 2p, O 1s and C 1s peaks are evaluated for elemental analysis. Elemental analysis from XPS shows that the film surface consisted of 7.3% Co, 12.4% Ca, 51.8% O and 28.5% C. The Ca:Co ratio on the film surface was 1.7× higher than the original Ca:Co ratio in the resin, indicating Ca migration to the film surface. High C and Ca content on the film surface was likely from calcium carbonate or bicarbonate phases forming on the film surface as a result of the reaction of Ca ions in the film with $H_2O$ and $CO_2$ in air. After ~30 nm of Ar-ion milling, XPS indicated atomic percentages of 25.6% Co, 18.4% Ca, 48.2% O and 7.8% C. This result implied that the Ca:Co ratio in the inner regions of the film was ~0.72, which is very close to the Ca:Co ratio of the stoichiometric $Ca_3Co_4O_9$ phase. However, the film was O deficient compared to the $Ca_3Co_4O_9$ phase, likely due to preferential etch of the O atoms by Ar-ion milling. The XPS after Ar-ion milling also showed a weak Ar 2p peak due to minor Ar deposition on the film (FIG. 3(b)).

In conclusion, p-type transparent conducting thin films of $Ca_3Co_4O_9$ were obtained using a scalable and cost-effective manufacturing technique. The FOM value for the p-type $Ca_3Co_4O_9$ films can be as high as 151 $M\Omega^{-1}$, exceeding the FOM values reported for other solution processed p-type TCO thin films, as well as those prepared by PVD and CVD. The lowest sheet resistance and highest visible range optical transmission for the TCO films were 5.7 kΩ/sq and 67.1%, respectively. Near infrared region optical transmission is as high as 85% for a most conductive TCO thin film. The embodied cost-effective, sol-gel based technique is compatible with most of the metallic species and it can be readily applied to other metal oxide thin film structures.

All references, including publications, patent applications, and patents cited herein are hereby incorporated by reference in their entireties to the same extent as if each reference was individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein (i.e., which are intended to have a relative uncertainty of 10% unless clearly otherwise indicated) are merely intended to serve as a shorthand method of referring individually to each separate value falling within the range, unless otherwise indicated herein, and each separate value is incorporated into the specification as if it was individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A p-type transparent conducting structure generated via solution-based synthesis, the structure comprising:
   an optically transparent substrate; and
   an at least partially crystalline p-type mixed metal oxide material having a chemical composition $Ca_xCo_yO_z$ and located upon the substrate without an epitaxial crystalline relationship with respect to the substrate, wherein when x is normalized to unity y ranges from about 1.2 to about 1.5, and z is selected consistent with x and y, considering the oxidation states of Ca and Co;
   wherein the structure has an optical transparency, and further wherein the structure exhibits p-type conductivity greater than 1 S/cm.

2. The structure of claim 1, wherein:
   the at least partially crystalline p-type mixed metal oxide material has the chemical composition $Ca_3Co_4O_9$.

3. The structure of claim 1 wherein:
   the mixed metal oxide material has an optical transparency in the visible range from about 31 to about 67 percent; and
   the mixed metal oxide material comprises a misfit crystal material.

4. The structure of claim 3 wherein the mixed metal oxide material shows no more than five peaks in an x-ray diffraction spectrum from 10 to 40 degrees position of 2Θ.

5. The structure of claim 1, wherein the mixed metal oxide material has an optical transparency in the near infrared range greater than 85%.

6. The structure of claim 1, wherein the structure exhibits conductivity greater than 15 S/cm.

* * * * *